US012575353B2

(12) United States Patent
Pranda et al.

(10) Patent No.: US 12,575,353 B2
(45) Date of Patent: Mar. 10, 2026

(54) METHOD FOR LATERAL ETCH WITH BOTTOM PASSIVATION

(71) Applicant: Tokyo Electron Limited, Tokyo (JP)

(72) Inventors: Adam Pranda, Albany, NY (US);
Yusuke Yoshida, Albany, NY (US);
Aelan Mosden, Albany, NY (US); Yun Han, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 315 days.

(21) Appl. No.: 18/362,608

(22) Filed: Jul. 31, 2023

(65) Prior Publication Data

US 2025/0046617 A1 Feb. 6, 2025

(51) Int. Cl.
| | |
|---|---|
| *H01L 21/311* | (2006.01) |
| *H01J 37/32* | (2006.01) |
| *H10D 30/01* | (2025.01) |
| *H10D 64/01* | (2025.01) |

(52) U.S. Cl.
CPC ...... *H01L 21/31116* (2013.01); *H01J 37/321* (2013.01); *H01J 37/32146* (2013.01); *H01L 21/31144* (2013.01); *H10D 30/014* (2025.01); *H10D 64/018* (2025.01); *H01J 2237/334* (2013.01)

(58) Field of Classification Search
None
See application file for complete search history.

(56) References Cited

U.S. PATENT DOCUMENTS

| | | | |
|---|---|---|---|
| 9,859,151 | B1 | 1/2018 | Zhu |
| 10,763,108 | B2 | 9/2020 | Hausmann et al. |
| 11,367,610 | B2 | 6/2022 | Kihara et al. |
| 2016/0260620 | A1 | 9/2016 | Briggs et al. |
| 2017/0178899 | A1 | 6/2017 | Kabansky et al. |
| 2019/0043732 | A1* | 2/2019 | Eason .................... H10B 43/27 |
| 2019/0259623 | A1 | 8/2019 | Sridhar et al. |
| 2021/0005472 | A1 | 1/2021 | Kanarik et al. |
| 2021/0225658 | A1 | 7/2021 | Lu et al. |

FOREIGN PATENT DOCUMENTS

| | | |
|---|---|---|
| CN | 113851376 A | 12/2021 |

OTHER PUBLICATIONS

International Search Report and Written Opinion, PCT/US2024/024736, Mailed Aug. 5, 2024, Total pp. 12.

* cited by examiner

*Primary Examiner* — Roberts P Culbert
(74) *Attorney, Agent, or Firm* — Slater Matsil, LLP

(57) ABSTRACT

A method of processing a substrate that includes: forming a bottom passivation layer including an oxide over a first portion of a dielectric layer at a bottom of a recess of the substrate, the recess having sidewalls including a second portion of the dielectric layer; and performing a lateral etch to etch the second portion of the dielectric layer, the bottom passivation layer covering the first portion of the dielectric layer during the lateral etch, and where the forming of the bottom passivation layer includes exposing the substrate to a first plasma including a halogen, and exposing the substrate to a second plasma including oxygen to form the bottom passivation layer.

20 Claims, 7 Drawing Sheets

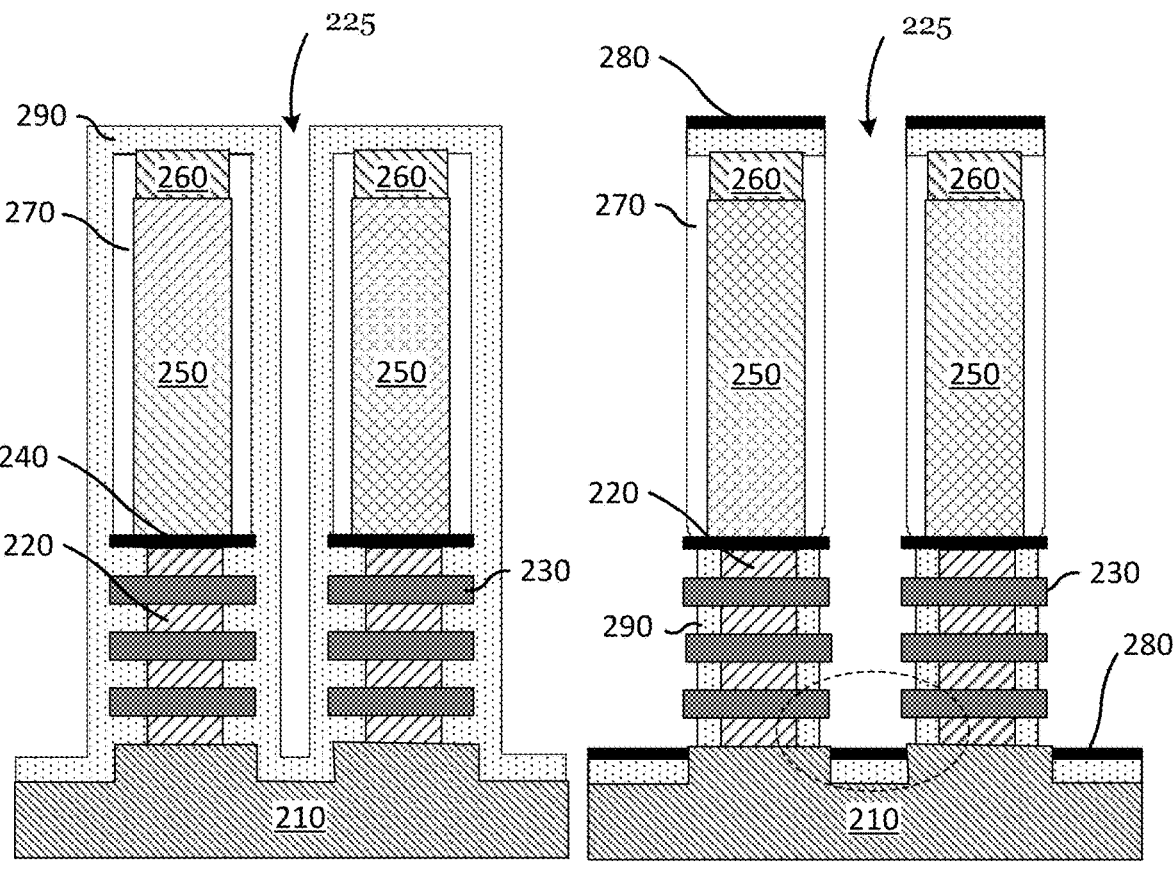
FIG. 2A                    FIG. 2B

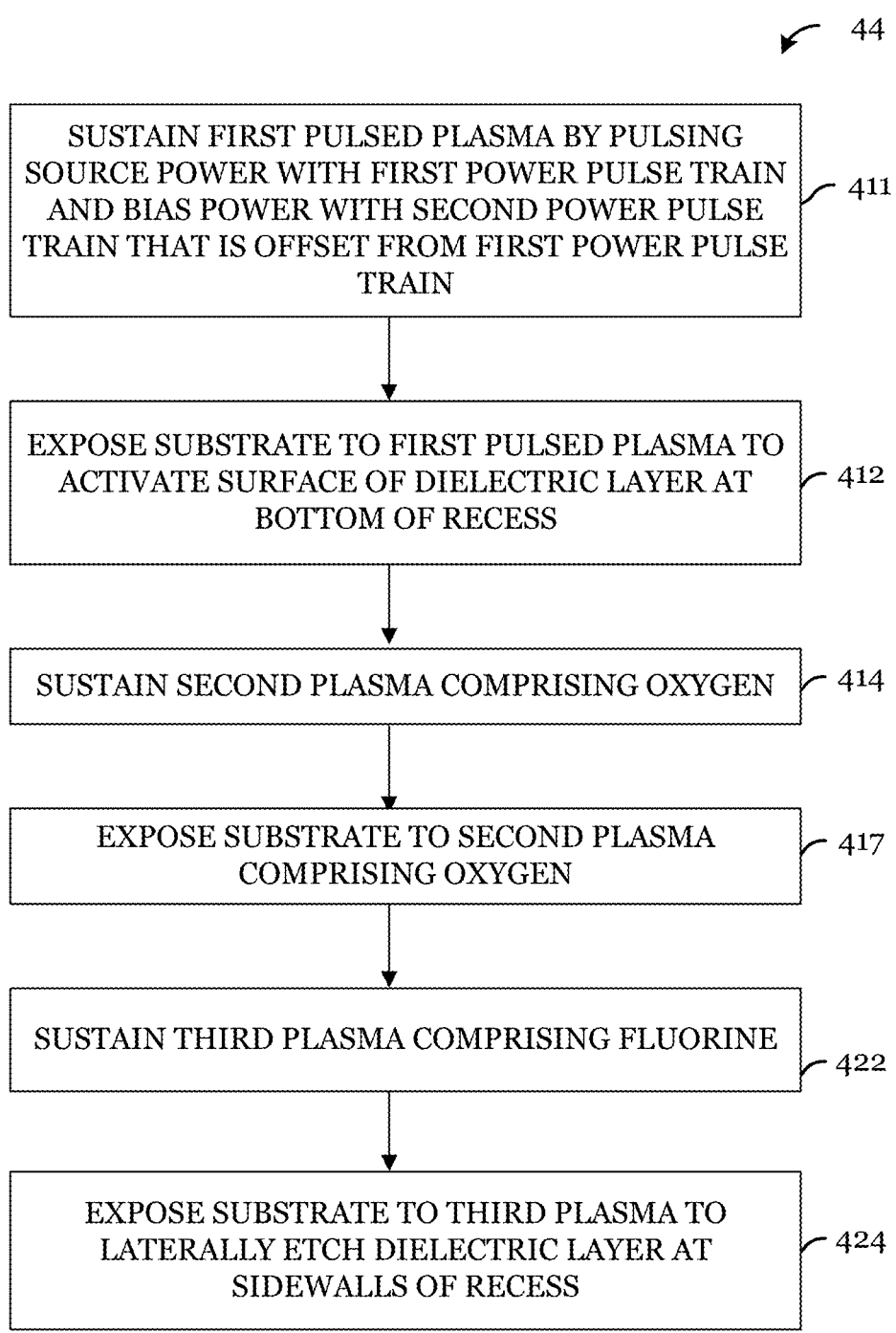

44

SUSTAIN FIRST PULSED PLASMA BY PULSING SOURCE POWER WITH FIRST POWER PULSE TRAIN AND BIAS POWER WITH SECOND POWER PULSE TRAIN THAT IS OFFSET FROM FIRST POWER PULSE TRAIN          411

EXPOSE SUBSTRATE TO FIRST PULSED PLASMA TO ACTIVATE SURFACE OF DIELECTRIC LAYER AT BOTTOM OF RECESS          412

SUSTAIN SECOND PLASMA COMPRISING OXYGEN          414

EXPOSE SUBSTRATE TO SECOND PLASMA COMPRISING OXYGEN          417

SUSTAIN THIRD PLASMA COMPRISING FLUORINE          422

EXPOSE SUBSTRATE TO THIRD PLASMA TO LATERALLY ETCH DIELECTRIC LAYER AT SIDEWALLS OF RECESS          424

FIG. 4C

METHOD FOR LATERAL ETCH WITH BOTTOM PASSIVATION

TECHNICAL FIELD

The present invention relates generally to methods of processing a substrate, and, in particular embodiments, to lateral etch with bottom passivation.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices is performed using plasma processes.

The semiconductor industry has repeatedly reduced the minimum feature sizes in semiconductor devices to a few nanometers to increase the packing density of components. Accordingly, the semiconductor industry increasingly demands plasma-processing technology to provide processes for patterning features with accuracy, precision, and profile control, often at atomic scale dimensions. These requirements are particularly stringent for three-dimensional (3D) structures, for example, a fin field-effect transistor (FinFET) wherein the gate electrode wraps around three sides of closely-spaced, narrow and long fin-shaped semiconductor features formed by etching trenches into the semiconductor substrate. Meeting this challenge along with the uniformity and repeatability needed for high volume IC manufacturing requires further innovations of plasma processing technology.

SUMMARY

In accordance with an embodiment of the present invention, a method of processing a substrate that includes: forming a bottom passivation layer including an oxide over a first portion of a dielectric layer at a bottom of a recess of the substrate, the recess having sidewalls including a second portion of the dielectric layer; and performing a lateral etch to etch the second portion of the dielectric layer, the bottom passivation layer covering the first portion of the dielectric layer during the lateral etch, and where the forming of the bottom passivation layer includes exposing the substrate to a first plasma including a halogen, and exposing the substrate to a second plasma including oxygen to form the bottom passivation layer.

In accordance with an embodiment of the present invention, a method of processing a substrate that includes: forming a silicon oxide-containing layer over a patterned dielectric layer of the substrate, the patterned dielectric layer including a recess having a bottom surface and sidewalls, the silicon oxide-containing layer being thicker over the bottom surface than over the sidewalls, the forming including a cyclic plasma process, each cycle of the cyclic plasma process including exposing the substrate to a first pulsed plasma, the first pulsed plasma being generated from a gas including $SiCl_4$ and sustained by pulsing a source power and a bias power, and exposing the substrate to a second plasma including oxygen to form the silicon oxide-containing layer.

In accordance with an embodiment of the present invention, a method of processing a substrate that includes:

sustaining a first pulsed plasma in a plasma processing chamber by pulsing a source power with a first power pulse train and pulsing a bias power with a second power pulse train that is offset from the first pulse train; exposing the substrate to the first pulsed plasma in the plasma processing chamber to activate a surface of a dielectric layer at a bottom of a recess; sustaining a second plasma including oxygen in the plasma processing chamber; exposing the substrate to the second plasma in the plasma processing chamber to form a bottom passivation layer over the dielectric layer at the bottom of the recess; sustaining a third plasma including fluorine in the plasma processing chamber; and exposing the substrate to the third plasma in the plasma processing chamber to laterally etch the dielectric layer at sidewalls of the recess, where the bottom passivation layer covering the dielectric layer at the bottom of the recess.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate cross-sectional views of a substrate at various stages of a fabrication process comprising a lateral etch with selective bottom passivation in accordance with various embodiments, wherein FIG. 1A illustrates the incoming substrate having a recess feature, FIG. 1B illustrates the substrate after a directional functionalization, FIG. 1C illustrates the substrate after a passivation layer formation, and FIG. 1D illustrates the substrate after a lateral etch;

FIGS. 2A-2B illustrate cross-sectional views of a substrate at various stages of a fabrication process for gate-all-around field effect transistors (GAAFETs) in accordance with one embodiment, wherein FIG. 2A illustrates the substrate comprising two dummy gate structures, a hard mask, and an underlying stack of nanosheets and sacrificial layers with two sidewall spacer layers, and FIG. 2B illustrates the substrate after a lateral etch with selective bottom passivation;

FIGS. 4A-4C illustrate process flow charts of methods of selective bottom passivation in accordance with various embodiments, wherein FIG. 4A illustrates an embodiment, FIG. 4B illustrates another embodiment, and FIG. 4C illustrates yet another embodiment.

DETAILED DESCRIPTION OF ILLUSTRATIVE EMBODIMENTS

Figures 1A, 1B:
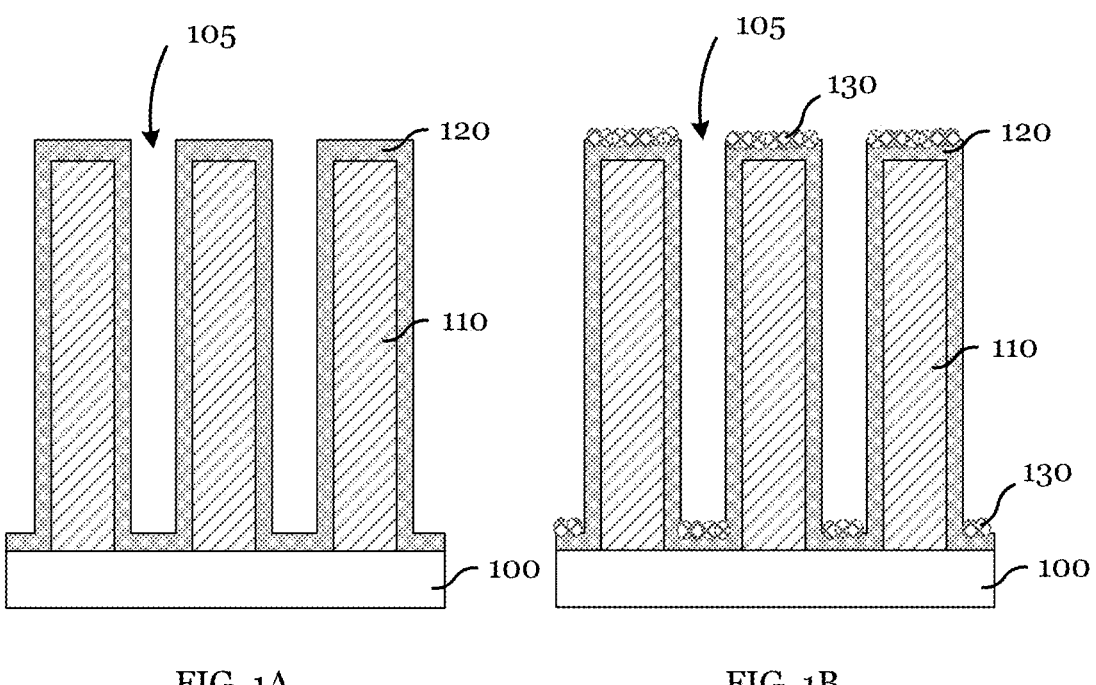

This application relates to methods of processing a substrate, more particularly to lateral etch with selective bottom passivation. Generally, fabricating complicated structures for advanced semiconductor devices, for example 3-D devices such as gate-all-around field effect transistors (GAAFETs), may require laterally removing materials to selectively expose a portion of the underlying structure. However, it is difficult to make lateral etching sufficiently selective because vertical etching may not be completely eliminated from the etching process. In certain cases, a poor directional selectivity of lateral etching may adversely cause damages to the device structure at the bottom. To overcome this issue, a new method of lateral etching with improved directional selectivity may be desired.

Embodiments of the present application disclose methods of plasma process comprising selective bottom passivation and lateral etching. In this disclosure, bottom passivation refers to a layer deposition or formation over a bottom portion of a recess feature, which may then protect an underlying layer during the lateral etch. In various embodiments, the selective bottom passivation may be achieved by a two-step process: a directional surface functionalization (e.g., a pulsed plasma process using SiCl$_4$) followed by a passivation layer formation (e.g., an oxygen plasma treatment). The two steps may be cyclically repeated to achieve a sufficient layer thickness of the bottom passivation layer. Various process parameters (e.g., plasma pulsing conditions) may be adjusted to optimize the selective bottom passivation, particularly its thickness and the directionality of layer formation. The directionality of layer formation (e.g., selectivity of passivation at the bottom relative to the sidewalls) is crucial in achieving the lateral etching selective to the bottom surface. The two-step process described with various embodiments in this disclosure may enable the directionality. The methods of lateral etch with selective bottom passivation described herein may then be applied to various semiconductor device fabrication, for example, as a sidewall spacer etch back in a GAAFETs fabrication process.

In the following, the steps of selective bottom passivation are described referring to FIGS. 1A-1D in accordance with various embodiments. An example application of the method of selective bottom passivation in GAAFETs fabrication is described referring to FIGS. 2A-2B. Details of plasma pulsing conditions useful for the step of directional functionalization are then described referring to FIG. 3. Example process flow diagrams are illustrated in FIG. 4A-4C. An example plasma system for performing the selective bottom passivation is described referring to FIG. 5. All figures in this disclosure are drawn for illustration purpose only and not to scale, including the aspect ratios of features.

FIGS. 1A-1D illustrate cross-sectional views of a substrate 100 at various stages of a fabrication process comprising a lateral etch with selective bottom passivation in accordance with various embodiments. In various embodiments, the selective bottom passivation may be performed as a plasma process comprising a directional functionalization (FIG. 1B) and a layer formation (FIG. 1C) as further described below.

FIG. 1A illustrates a cross-sectional view of an incoming substrate 100. In various embodiments, the substrate 100 may be a part of, or include, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate.

In various embodiments, the substrate 100 is patterned or embedded in other components of the semiconductor device.

As illustrated in FIG. 1A, a material layer 110 may be formed over the substrate 100. In various embodiments, as a result of prior processes (e.g., reactive ion etching), the material layer 110 is patterned to have one or more recess features. In certain embodiments, the recess features may comprise a high aspect ratio (HAR) feature having aspect ratio between 10:1 and 100:1. In FIG. 1A, recesses 105 have been formed. The recesses 105 may comprise a hole, slit, or other suitable structures comprising a recess for semiconductor device fabrication. In one or more embodiments, the recesses 105 comprises a series of line recesses with a pitch size between 10 nm and 200 nm.

In certain embodiments, the material layer 110 may comprise polysilicon or amorphous silicon. Further, the material layer 110 may be a layer stack made of multiple layers. The material layer 110 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the material layer 110 has a thickness between 1 μm and 10 μm.

Still referring to FIG. 1A, a dielectric layer 120 may be over the material layer 110. In various embodiments, the dielectric layer 120 may comprise a low-k dielectric such as silicon carbide (SiC), silicon oxycarbide (SiOC), silicon nitride (SiN), and silicon oxynitride (SiON). The dielectric layer 120 may be formed using a conformal deposition technique such as chemical vapor deposition (CVD), physical vapor deposition (PVD), atomic layer deposition (ALD), as well as other plasma processes such as plasma enhanced CVD (PECVD) and other processes. Accordingly, the dielectric layer 120 may cover the top surface and sidewalls of the material layer 110 as well as the exposed surface of the substrate 100 at the bottom of the recesses 105. The dielectric layer 120 and the material layer 110 may be collectively considered as a part of the substrate 100. Further, the substrate 100 may also comprise other layers.

FIG. 1B illustrates a cross-sectional view of the substrate 100 after a directional functionalization.

The first step of the selective bottom passivation may be to selectively functionalize a horizontal surface of a layer to be protected (directional surface functionalization). In various embodiments, the directional surface functionalization may be performed by exposing the substrate 100 to a first plasma comprising a halogen. The exposure to the first plasma may activate, for example via halogenation, the horizontal surface of the dielectric layer 120 at the bottom of the recess 105. As described below (FIG. 1C), the activated surface formed by the directional surface functionalization may be used for the selective formation of a bottom passivation layer in the subsequent step. In certain embodiments, the first plasma may be generated from a process gas comprising chlorosilane such as SiCl$_4$ and SiH$_3$Cl. In other embodiments, the process gas may comprise a silane with a different halogen such as fluorosilane and bromosilane. In one or more embodiments, other gases (e.g., HBr, BCl$_3$, or NH$_3$/N$_2$) may be used for the directional surface functionalization.

Although not wishing to be limited by any theory, the directional surface functionalization may selectively functionalize or modify the horizontal surface exposed by the bombardment of reactive species (e.g., ions and/or radicals) under a plasma. The directionality (i.e., predominantly directed in a vertical direction in FIG. 1B) of the reactive species may advantageously enable the selective modification of the horizontal surface relative to the vertical surfaces (e.g., the sidewalls). As a result, as illustrated in FIG. 1B, a functionalized surface 130 may be selectively formed over the horizontal surface of the dielectric layer 120. It should be noted that the formation of the functionalized surface 130 may be based on several mechanism and not be limited to a single mechanism. For example, in certain embodiments, the process may be predominantly based on a chemical functionalization (e.g., halogenation) of the surface without a substantial material deposition over the surface, but in other embodiments, the process may also involve a material deposition (e.g., a deposition precursor in the first plasma) over the surface to form a deposition layer. In this disclosure, the functionalized surface 130 is used to include any deposited layer that may be formed as a result of the directional surface functionalization. The functionalized surface 130 may be required for or able to enhance the layer formation in the subsequent step.

In certain embodiments, the process gas for the selective bottom passivation may also comprise other gases such as a noble gas and dinitrogen ($N_2$). In various embodiments, the first plasma may be a pulsed plasma, and the plasma conditions may be adjusted to generate a sufficient amount of reactive species useful for the surface functionalization. The reactive species may be provided with kinetic energy from a bias power applied to the plasma, and thereby their flux may be maintained relatively unchanged throughout the recesses 105. As a result, the reactive species may advantageously be delivered to the bottom of the recesses 105. Accordingly, the first plasma used for the directional surface functionalization may be provided with a bias power (fixed or pulsed). Plasma parameters and pulsing schemes in various embodiments to achieve conditions desired for directional surface functionalization will be described in detail below referring to FIG. 3.

In various embodiments, the directional surface functionalization may be performed at a chamber pressure between 1 mTorr and 100 mTorr in one embodiment. The inventors of this application identified that maintaining a relatively low chamber pressure (e.g., <100 mTorr) for this step may be critical to achieve the desired level of directionality of surface functionalization by the first plasma.

Figures 1C, 1D:
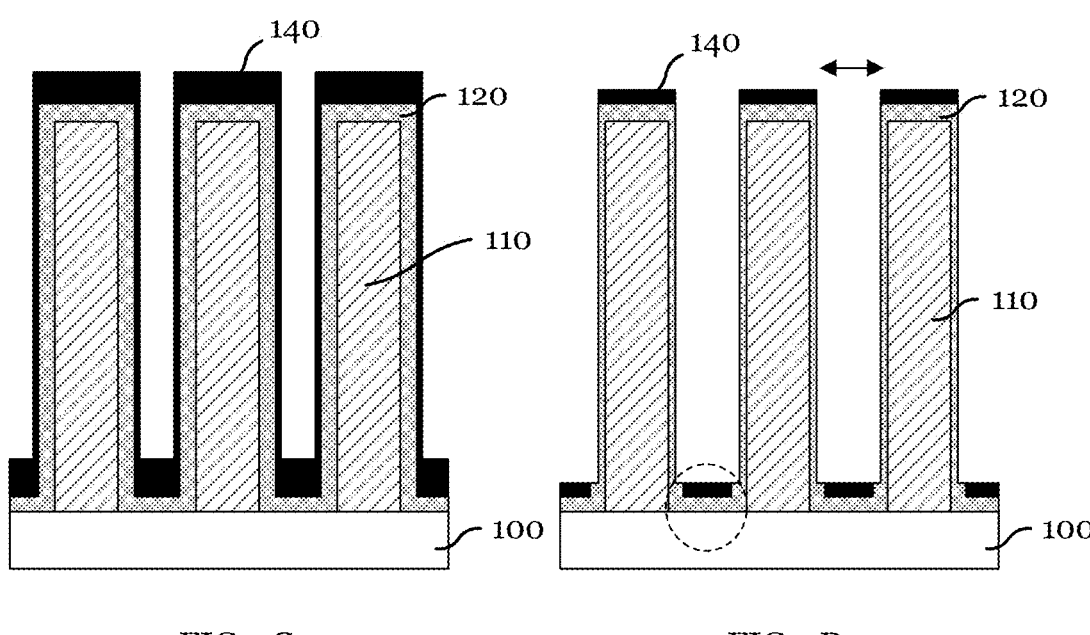

FIG. 1C illustrates a cross-sectional view of the substrate 100 after a passivation layer formation.

The second step of the selective bottom passivation after the directional surface functionalization may be to further modify the functionalized surface 130 to form a passivation layer 140. In certain embodiments, the passivation layer 140 may comprise an oxide, for example silicon oxide. In one embodiment, silicon elements of the passivation layer 140 may originate from silicon used in a process gas for the first plasma (FIG. 1B) and also silicon from the dielectric layer 120. In various embodiments, the chemical compositions of the passivation layer 140 and the dielectric layer 120 may need to be sufficiently different to enable etch selectivity in the lateral etch.

In various embodiments, the step of layer formation may be performed by exposing the substrate 100 to a second plasma comprising oxygen. In certain embodiments, the first plasma may be generated from a process gas comprising dioxygen ($O_2$). Although not wishing to be limited by any theory, the oxygen from the second plasma may be incorporated into the passivation layer 140 comprising an oxide. In certain embodiments, the process gas for the layer formation may also comprise other gases such as a noble gas and dinitrogen ($N_2$). In various embodiments, the step of layer formation with the second plasma may be performed without providing a bias power, in contrast to the first plasma with a certain level of bias power, and the effect of plasma exposure may be mostly isotropic.

In various embodiments, for the second plasma used in the step of layer formation, the source power may be between 50 W and 1000 W and the bias power may be between 0 W and 500 W. Total gas flow may be between 20 to 2000 sccm. Process pressure may be between 5 to 100 mTorr.

In various embodiments, the passivation layer 140 may be selectively grown over the horizontal surface (i.e., the functionalized surface 130 over the dielectric layer 120 in FIG. 1C). As illustrated in FIG. 1C, the passivation layer 140 may cover the top and bottom surfaces of the feature. Further, in certain embodiments, some degree of layer formation, although thinner than the horizontal surfaces, may also occur over the sidewalls as further illustrated in FIG. 1C. In various embodiments, various process parameters for the selective bottom passivation may be adjusted to optimize the anisotropy (directionality) of the final layer formation. Accordingly, the sidewalls may be free of layer formation during the selective bottom passivation, or the rate of layer formation over the sidewalls may be minimized relative to the rate of layer formation over the horizontal surfaces. The anisotropic layer formation (horizontal versus vertical) is critical for providing proper selective bottom passivation during a subsequent lateral etch. Generally, the passivation layer 140 at the bottom of the recesses 105 is required to be sufficiently thick to protect the underlying layer structure, while the passivation layer 140 at the sidewalls, if any, is required to be thin enough to be removed such that the lateral etch can etch the underlying layer (e.g., the dielectric layer 120 at the sidewalls).

Although this disclosure describes the directionality of layer formation with embodiments with two perpendicular surfaces (i.e., horizontal and vertical), in various embodiments, the methods may be applied to process a substrate with different features with non-perpendicular surfaces. The directionality of selective bottom passivation may therefore be extended to the formation of a passivation layer with varying thickness that depends on surface angle, and thus potentially enabling a surface angle-dependent etch process.

In various embodiments, to achieve the target profile for the passivation layer 140 (i.e., sufficient thickness at the bottom while minimizing the layer over the sidewalls), the steps of directional surface functionalization and the layer formation may be cyclically repeated for any number of times. In one or more embodiments, each step may be performed for 10-60 sec and repeated cyclically. In another embodiment, the process time for each step may be longer than 60 sec depending on the geometry and application.

FIG. 1D illustrates a cross-sectional view of the substrate 100 after a lateral etch.

After forming the passivation layer 140 (FIGS. 1B-1C), the lateral etch may be performed. In various embodiments, the lateral etch may be a reactive ion etching (RIE) process performed by exposing the substrate to the third plasma. In one or more embodiments, the third plasma for the lateral etch may be generated from a fluorine-containing gas. Examples of the fluorine-containing gas may include but are not limited to tetrafluoromethane ($CF_4$), nitrogen trifluoride ($NF_3$), fluoroform ($CHF_3$), difluoromethane ($CH_2F_2$), fluoromethane ($CH_3F$) and combinations thereof. In certain embodiments, the etch gas further comprises oxygen ($O_2$) at any ratio. In one or more embodiments, the etch gas further comprises 0.1% to 10% by volume of oxygen. The etch gas may further comprise a diluent such as argon (Ar) and nitrogen ($N_2$) at any ratio.

The plasma condition may be adjusted to make the plasma sufficiently isotropic such that the etching can occur at the sidewalls and widen the width of the recesses 105. In various embodiments, the passivation layer 140 formed in the previous process can provide selective bottom passivation protecting the dielectric layer 120 at the bottom of the recesses 105 from the third plasma, as indicated by a dotted circle in FIG. 1D.

As previously illustrated in FIG. 1C, in certain embodiments, the passivation layer 140 may be also present over the sidewalls, and the sidewall portion of the passivation layer 140 may be removed at the beginning of the lateral etch and then the next layer (i.e., the dielectric layer 120) may be etch laterally. In these scenarios, the lateral etch chemistry may be selected to etch both of the two layers, which may cause some loss of the passivation layer 140 at the bottom of the recesses 105. Even so, since the passivation layer 140 can be formed to be substantially thicker at the bottom than over the sidewalls, with a proper process control (e.g., isotropic etch conditions and process time), it is possible to enable the lateral etch of the dielectric layer 120 without completely consuming the passivation layer 140 at the bottom (FIG. 1D).

In various embodiments, the lateral etch may be halted to insert another cycle of selective bottom passivation to replenish the passivation layer 140 at the bottom. Similarly, to optimize the anisotropy of the lateral etch, the selective bottom passivation (FIGS. 1B-1C) and the lateral etch (FIG. 1D) may be cyclically repeated for any number of times.

In accordance with certain embodiments, after the lateral etch, a portion of the dielectric layer 120 may be still present, although thinned, over the sidewalls. This may be particularly useful when the lateral etch is used to only partially remove the dielectric layer 120 and expose a feature initially embedded within the dielectric layer 120 (not illustrated in FIGS. 1A-1D). Such an example with the additional embedded feature is described below in a fabrication process for gate-all-around field effect transistors (GAAFETs) referring to FIGS. 2A-2B. In other embodiments, although not specifically illustrated, the lateral etch may be performed to completely remove the dielectric layer 120 from the sidewalls.

FIGS. 2A-2B illustrate cross-sectional views of a substrate 210 at various stages of a fabrication process for gate-all-around field effect transistors (GAAFETs) in accordance with one embodiment.

FIG. 2A illustrates a cross-sectional view of the substrate 210 at an intermediate stage of fabricating GAAFETs, comprising two dummy gate structures, a hard mask, and an underlying stack of nanosheets and sacrificial layers with two sidewall spacer layers.

In various embodiments, the substrate 210 may comprise a plurality of nanosheet layers or nanosheets 230 formed therein. Specifically, the nanosheets 230 are embedded in a different material. The nanosheets 230 may be spaced apart from each other by one of a plurality of sacrificial layers or sacrificial layers 220. Thus, the substrate 210 comprises alternating layers of the sacrificial layers 220 and the nanosheets 230. It should be noted that while three layers of the nanosheets 230 are depicted in FIG. 1A, the number of layers is not limited. In various embodiments, the nanosheets 230, at the end of fabrication, may form the transistor channels, while the sacrificial layers 220 will be removed in a later step of fabrication to free up a void space for the formation of gate dielectric and gate terminal. In various embodiments, the nanosheets 230 have thickness of a few nanometer to tens of nanometer, for example, about 1 nm to about 20 nm in one embodiment. In another embodiment, the nanosheets 230 have thickness of about 1 nm to about 10 nm in one embodiment. In certain embodiments, the sacrificial layers 220 comprise silicon germanium (SiGe) and the nanosheets 230 comprise silicon. In alternate embodiments, the sacrificial layers 220 comprise silicon and the nanosheets 230 comprise silicon germanium.

In certain embodiments, a stack of the nanosheets 230 and the sacrificial layer 220 may be formed by deposition processes, for example, epitaxially by a chemical vapor deposition (CVD) method. In various embodiments, each layer of the sacrificial layers 220 and the nanosheets 230 may be few to several nanometers in thickness. In one embodiment, each layer of the sacrificial layers 120 may have a thickness between 5 nm and 20 nm and each layer of the nanosheets 230 may have a thickness between 1 nm and 10 nm.

As further illustrated in FIG. 2A, the substrate 210 may comprise a dielectric blocking layer 240 over the alternating layer stack of the nanosheets 230 and the sacrificial layer 220. The dielectric blocking layer 240 may be an oxide layer in one embodiment. The dielectric blocking layer 240 may be formed by deposition processes, for example, by a CVD method. The dielectric blocking layer 240 may be used as an etch stop layer and may be optional.

The substrate 210 may further comprise a dummy stack comprising a dummy material over the stack of the nanosheets 230 and the sacrificial layer 220. The dummy stack is patterned to form a dummy gate 250. In FIG. 2A, a feature of two fins for dummy gate 250 is illustrated as example. The dummy gate 250 may comprise polysilicon or amorphous silicon as example. The dummy gate 250 may be deposited using deposition techniques such as vapor deposition including chemical vapor deposition (CVD), physical vapor deposition (PVD), as well as other plasma processes such as plasma enhanced CVD (PECVD), sputtering, and other processes. The dummy gate 250 may have a thickness of about 50 nm to about 500 nm in various embodiments. Still referring to FIG. 2A, a hard mask 260 used for patterning and forming the dummy gate structure may be present over the dummy gate 250. The hard mask 260 may comprise silicon oxide in one embodiment. In various embodiments, the hard mask 260 may comprise silicon nitride, silicon carbonitride (SiCN), or silicon oxycarbide (SiOC).

Over the dummy gate 250 and the alternating layer stack of the nanosheets 230 and the sacrificial layer 220, a first sidewall spacer layer 270 may be deposited. In various embodiments, the first sidewall spacer layer 270 may comprise a dielectric material comprising an oxide or a nitride. In certain embodiments, the first sidewall spacer layer 270 may comprise silicon-containing dielectric materials such as silicon oxide, silicon oxynitride (SiON), silicon oxycarbonitride (SiOCN) and silicon boron carbonitride (SiBCN). The first sidewall spacer layer 270 may be deposited using deposition techniques such as vapor deposition including chemical vapor deposition (CVD), physical vapor deposition (PVD), as well as other plasma processes such as plasma enhanced CVD (PECVD), atomic layer deposition (ALD), sputtering, and other processes. The first sidewall spacer layer 270 may have a thickness of about 1 nm to about 10 nm in various embodiments.

In certain embodiments, a gate height may be between 200 nm and 250 nm and the distance between the two gate structures may be between 6 nm and 12 nm. This high aspect ratio makes it challenging to lateral etch target materials sufficiently from the trench while preventing any damage to other materials.

In FIG. 2A, the substrate 210 may have been processed to form a recess feature for the channel regions of the transistors under the dummy gate structures, as well as a lateral recess etch to generate a lateral recess feature between layers of the nanosheets 230. Further, a second sidewall spacer layer 290 may be deposited over the substrate 210. In this step, the lateral recess generated in the previous step (i.e., the spaces between layers of the nanosheets 230) is also filled with the second sidewall spacer layer material. In certain embodiments, the second sidewall spacer layer 290 may comprise silicon-containing dielectric low-k dielectric materials such as silicon nitride, silicon carbonitride (SiCN), silicon oxycarbonitride (SiOCN) and silicon boron carbonitride (SiBCN). The formation of the second sidewall spacer layer 290 may be performed by deposition from a gas phase, for example, using chemical vapor deposition (CVD), plasma-enhanced CVD (PECVD), low-pressure CVD (LPCVD) physical vapor deposition (PVD), atomic layer deposition (ALD), and/or other deposition processes. For a plasma deposition process, a precursor gas mixture may be used including but not limited to silanes, hydrocarbons, fluorocarbons, or nitrogen containing compounds in combination with one or more dilution gases (e.g., argon, nitrogen, etc.) at a variety of pressure, power, flow and temperature conditions. The second sidewall spacer layer 290 is the layer to be laterally etch with selective bottom passivation and may correspond to the dielectric layer 120 illustrated in FIGS. 1A-1D in prior embodiments.

FIG. 2B illustrates a cross-sectional view of the substrate 210 after a lateral etch with selective bottom passivation. The details of the selective bottom passivation may be the same as previously described in the prior embodiments, and thus will not be repeated.

In various embodiments, a second sidewall spacer etch back may be performed to laterally remove only a portion of the second sidewall spacer layer 290 and expose tips of the nanosheets 230. However, the aspect ratio of the feature and the difficultly of lateral etch in general makes it challenging to avoid damaging the bottom portion of the feature (at the bottom of a recess 225 in FIG. 2B). Accordingly, the methods of selective bottom passivation may be applied to protect the substrate 210 and any structures in this region. A passivation layer 280 may be formed as described previously and may advantageously protect the bottom portion of the feature during the second sidewall spacer etch back process as indicated by a dotted circle in FIG. 2B.

In various embodiments, the second sidewall spacer etch back process comprises one or more wet etch processes, plasma etch processes, reactive ion etch (RIE) processes, or combinations of these or other etch processes. After the second sidewall spacer etch back process, some portions of the second sidewall spacer layer 290 are left between the layers of nanosheets 230. The remaining portions of the second sidewall spacer layer 290 ensures the electrical insulation between the gate region and source/drain region that will be formed at later steps in fabrication.

Figure 3:
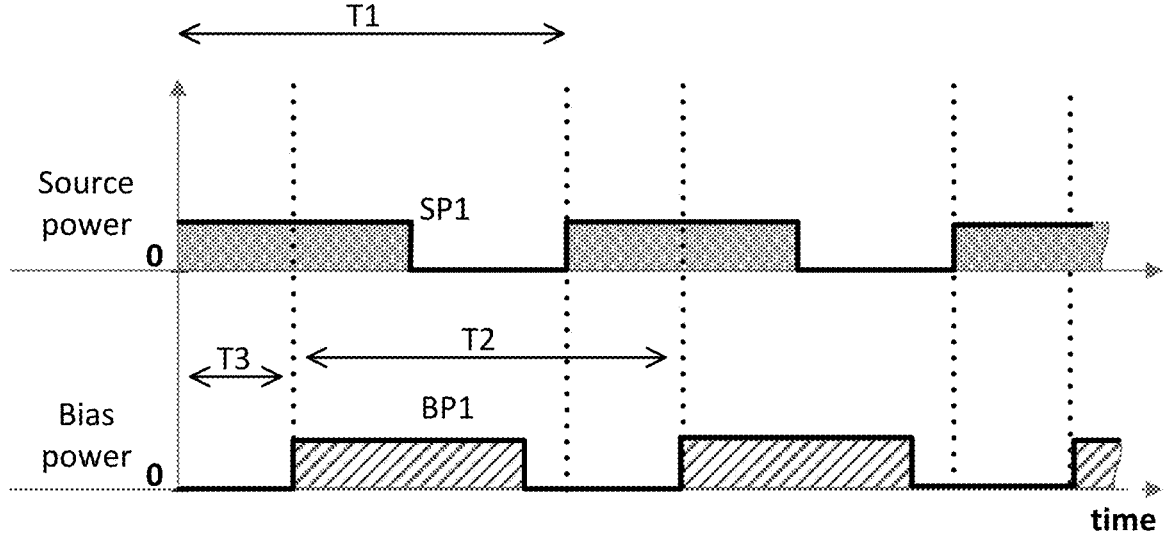
FIG. 3 illustrates a timing diagram of plasma power pulsing for the directional functionalization in accordance with an embodiment.
Figure 4A:
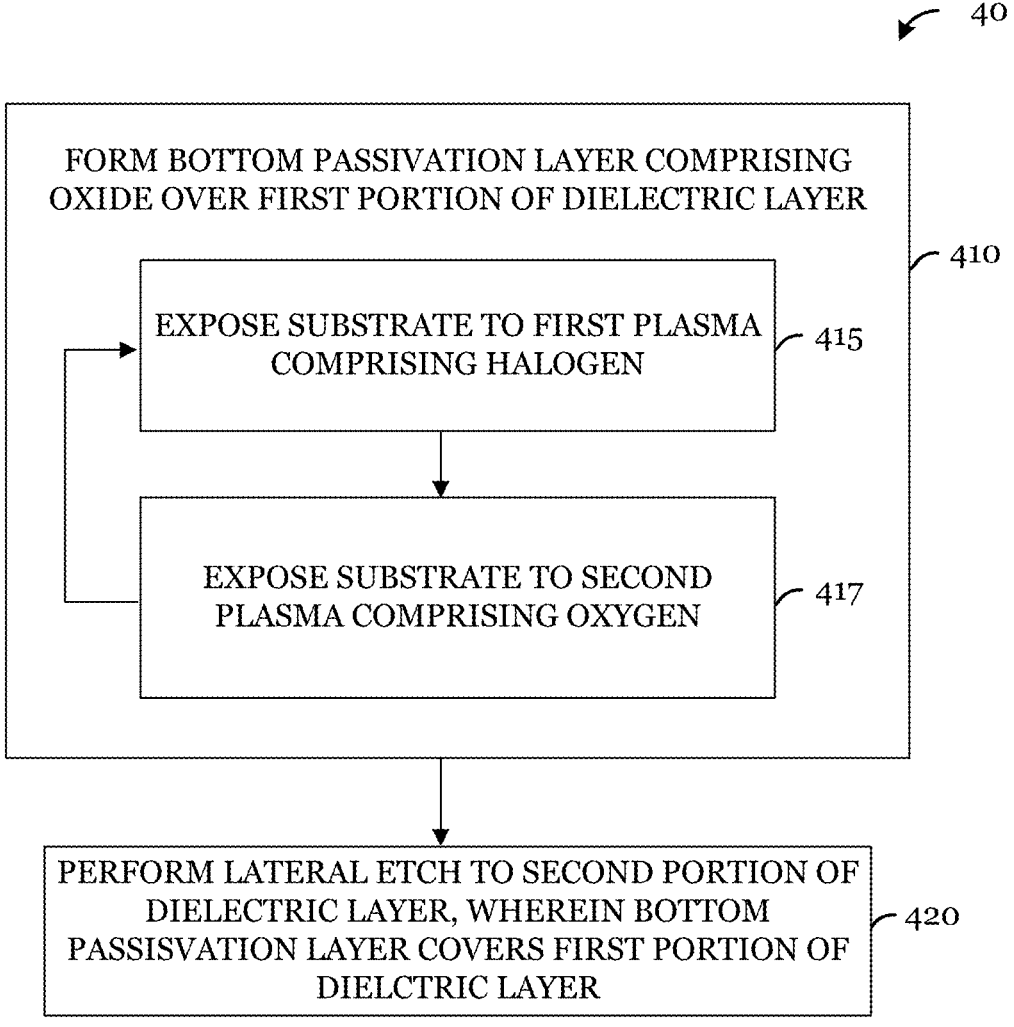
Figure 4B:
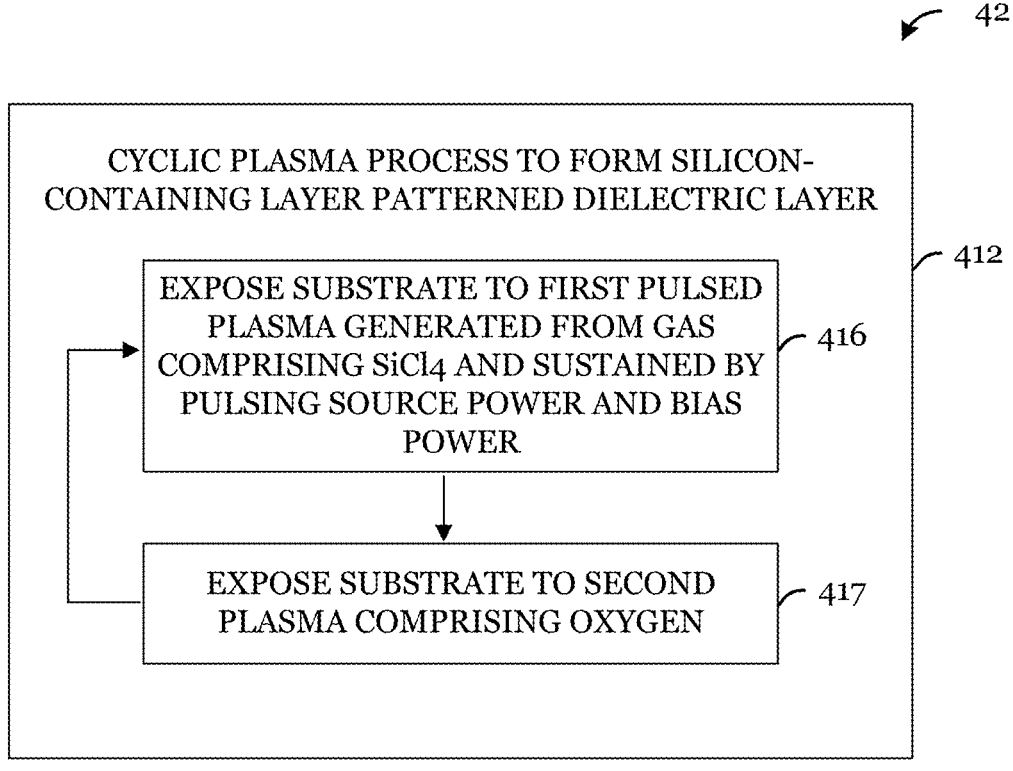

FIG. 3 illustrates a timing diagram of plasma power pulsing for the directional functionalization in accordance with an embodiment.

In various embodiments, the step of directional surface functionalization (e.g., FIG. 1B) may use a pulsed plasma with various pulsing patterns. The horizontal axes in FIG. 3 represent progression in time. Example power pulse trains for source power (SP) and bias power (BP) for the first plasma used in directional surface functionalization are plotted in FIG. 3. For the SP and BP, two power cycles are fully plotted and a third power cycle is plotted partially. Time durations T1 and T2 represent one pulse cycle for the SP and BP, respectively. A time duration T3 represents an offset for the BP pulse train relative to the SP pulse train. Dotted lines are used to indicate the timing of turning on power (SP or BP), which corresponds to the beginning of each power pulse.

In various embodiments, the SP and BP may be set at a first source power level (SP1) and a first bias power level (BP1), respectively. The power levels may be selected to allow the first plasma to induce directional surface functionalization. In one embodiment, the SP1 may be between 50 W and 1000 W and the BP1 may be between 50 W and 100 W. The BP1 may be selected to achieve and maintain the sufficient level of directionality of reactive species in the first plasma such that the surface functionalization may be primarily on the horizontal surfaces.

In certain embodiments, the SP pulse train may have a duty cycle between 10% and 80%, and the BP pulse train has a duty cycle between 10% and 80%. In one embodiment, at least one of their duty cycle is between 40% and 60%. In various embodiments, the SP pulse train may have a frequency between 100 Hz and 10 kHz, and the BP pulse train may have a frequency between 100 Hz and 10 KHz.

In various embodiments, as illustrated in FIG. 3, the BP pulse train may be offset with T3 relative to the SP pulse train. The inventors of this application has identified that having the offset for the BP pulse train can advantageously improve the result of selective bottom passivation, and the level of offset may be adjusted to optimize the selective bottom passivation. In certain embodiments, the offset may be between 20% and 80% of the SP-on time duration of one cycle, and in another embodiment, the offset may be between 40% and 60%.

Although not specifically described in FIG. 3, any other process parameters such as process pressure, gas flow rates, temperature may be controlled independently at any stage in accordance with the respective process recipe. In various embodiments, the substrate is kept at a temperature between 10° C. and 120° C.

Further, it should be noted that the plots in FIG. 3 are for illustrative purposes only. For example, the plots show the process parameters to be changing as step functions, although the SP and BP may be modulated differently, for example, with a wave function. In another embodiment, the SP and BP pulse trains may comprise sub-set of power level settings and have more than one power level. Further, the SP and BP pulse trains in FIG. 3 have the same pulse frequency and the same duty cycle, but in various embodiments, they may be selected individually and not necessarily kept same to each other.

FIGS. 4A-4C illustrate process flow charts of methods of selective bottom passivation in accordance with various embodiments. The process flow can be followed with the figures (FIGS. 1A-1D and 3) discussed above and hence will not be described in detail again.

In FIG. 4A, a process flow 40 starts with forming a bottom passivation layer comprising an oxide over a first portion of a dielectric layer at a bottom of a recess of a substrate (block 410), where the recess has sidewalls comprising a second portion of the dielectric layer. The bottom passivation layer may be formed by first exposing the substrate to a first plasma comprising a halogen to halogenate a surface of the dielectric layer at the bottom of the recess (block 415, FIG.

1B), followed by exposing the substrate to a second plasma comprising oxygen to form the bottom passivation layer (block 417, FIG. 1C). In certain embodiments, the step of exposing to the first and second plasmas may be cyclically repeated to achieve a target thickness of the bottom passivation layer. Subsequently, a lateral etch may be performed to etch the second portion of the dielectric layer at the sidewalls, where the bottom passivation layer covers the first portion of the dielectric layer below the bottom passivation layer during the lateral etch (block 420, FIG. 1D).

In FIG. 4B, another process flow 42 is for forming a silicon oxide-containing layer over a patterned dielectric layer of the substrate, where the patterned dielectric layer comprises a recess having a bottom surface and sidewalls by a cyclic plasma process (block 412). Each cycle of the cyclic plasma process may comprise exposing the substrate to a first pulsed plasma generated from a gas comprising $SiCl_4$ and sustained by pulsing a source power and a bias power (block 416, FIG. 1B), and exposing the substrate to a second plasma comprising oxygen to form the silicon oxide-containing layer (block 417, FIG. 1C). In certain embodiments, the silicon oxide-containing layer formed by the cyclic plasma process may be thicker over the bottom surface than over the sidewalls.

In FIG. 4C, another process flow 44 starts with sustaining a first pulsed plasma in a plasma processing chamber by pulsing a source power with a first power pulse train and pulsing a bias power with a second power pulse train that is offset from the first pulse train (block 411, FIG. 3), followed by exposing the substrate to the first pulsed plasma in the plasma processing chamber to activate a surface of a dielectric layer at a bottom of a recess (block 412, FIG. 1B). Subsequently, a second plasma comprising oxygen may be sustained in the plasma processing chamber (block 414), and the substrate may be exposed to the second plasma in the plasma processing chamber to form a bottom passivation layer over the dielectric layer at the bottom of the recess (block 417, FIG. 1C). After forming the bottom passivation layer, a third plasma comprising fluorine may then be sustained in the plasma processing chamber (block 422), followed by exposing the substrate to the third plasma in the plasma processing chamber to laterally etch the dielectric layer at sidewalls of the recess (block 424, FIG. 1D), where the bottom passivation layer covers the dielectric layer at the bottom of the recess.

Figure 5:
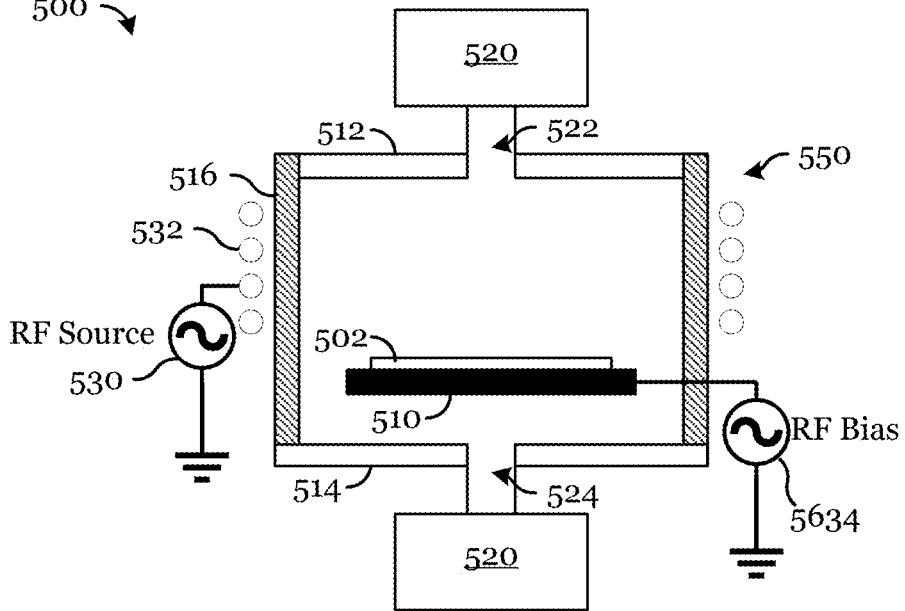
FIG. 5 illustrates a plasma system for performing a lateral etch with selective bottom passivation in accordance with various embodiments.

FIG. 5 illustrates a plasma system 500 for performing a lateral etch with selective bottom passivation in accordance with various embodiments.

FIG. 5 illustrates a plasma system 500 for performing a process of selective bottom passivation, for example illustrated in the flow diagram in FIGS. 4A-4C. In various embodiments, the plasma system 500, configured to sustain inductively coupled plasma (ICP), may advantageously be used to perform both the selective bottom passivation (the directional surface functionalization with the first plasma and the layer formation with the second plasma) and subsequent lateral etch process. Accordingly, the method of selective bottom passivation may be implemented in the existing process flow without requiring a new tool.

The plasma system 500 has a plasma processing chamber 550 configured to sustain plasma directly above a substrate 502 loaded onto a substrate holder 510. A process gas may be introduced to the plasma processing chamber 550 through a gas inlet 522 and may be pumped out of the plasma processing chamber 550 through a gas outlet 524. The gas inlet 522 and the gas outlet 524 may comprise a set of multiple gas inlets and gas outlets, respectively. The gas flow rates and chamber pressure may be controlled by a gas flow control system 520 coupled to the gas inlet 522 and the gas outlet 524. The gas flow control system 520 may comprise various components such as high pressure gas canisters, valves (e.g., throttle valves), pressure sensors, gas flow sensors, vacuum pumps, pipes, and electronically programmable controllers. An RF bias power source 534 and an RF source power source 530 may be coupled to respective electrodes of the plasma processing chamber 550. The substrate holder 510 may also be the electrode coupled to the RF bias power source 534. The RF source power source 530 is shown coupled to a helical electrode 532 coiled around a dielectric sidewall 516. In FIG. 5, the gas inlet 522 is an opening in a top plate 512 and the gas outlet 524 is an opening in a bottom plate 514. The top plate 512 and bottom plate 514 may be conductive and electrically connected to the system ground (a reference potential).

The plasma system 500 is by example only. In various alternative embodiments, the plasma system 500 may be configured to sustain inductively coupled plasma (ICP) with RF source power coupled to a planar coil over a top dielectric cover, or capacitively coupled plasma (CCP) sustained using a disc-shaped top electrode in the plasma processing chamber 550. Gas inlets and outlets may be coupled to sidewalls of the plasma processing chamber, and pulsed RF power sources and pulsed DC power sources may also be used in some embodiments.

Example embodiments of the invention are summarized here. Other embodiments can also be understood from the entirety of the specification as well as the claims filed herein.

Example 1. A method of processing a substrate that includes: forming a bottom passivation layer including an oxide over a first portion of a dielectric layer at a bottom of a recess of the substrate, the recess having sidewalls including a second portion of the dielectric layer; and performing a lateral etch to etch the second portion of the dielectric layer, the bottom passivation layer covering the first portion of the dielectric layer during the lateral etch, and where the forming of the bottom passivation layer includes exposing the substrate to a first plasma including a halogen, and exposing the substrate to a second plasma including oxygen to form the bottom passivation layer.

Example 2. The method of example 1, further including repeating the forming of the bottom passivation layer and the lateral etch.

Example 3. The method of one of examples 1 or 2, where the forming of the bottom passivation layer further includes repeating the steps of exposing to the first plasma and exposing to the second plasma to further grow the bottom passivation layer.

Example 4. The method of one of examples 1 to 3, where the bottom passivation layer includes silicon oxide and the dielectric layer includes a silicon-containing low-k dielectric.

Example 5. The method of one of examples 1 to 4, where the first plasma is generated from a gas including $SiCl_4$.

Example 6. The method of one of examples 1 to 5, where exposing the substrate to the first plasma halogenates a surface of the dielectric layer at the bottom of the recess, and where the bottom passivation layer includes silicon oxide.

Example 7. A method of processing a substrate that includes: forming a silicon oxide-containing layer over a patterned dielectric layer of the substrate, the patterned dielectric layer including a recess having a bottom surface and sidewalls, the silicon oxide-containing layer being thicker over the bottom surface than over the sidewalls, the forming including a cyclic plasma process, each cycle of the cyclic plasma process including exposing the substrate to a first pulsed plasma, the first pulsed plasma being generated from a gas including $SiCl_4$ and sustained by pulsing a source power and a bias power, and exposing the substrate to a second plasma including oxygen to form the silicon oxide-containing layer.

Example 8. The method of example 7, further including: laterally etching the silicon-containing layer and the patterned dielectric layer by exposing the substrate to a third plasma; and stopping the laterally etching before the bottom surface is exposed.

Example 9. The method of one of examples 7 or 8, where the source power and the bias power are pulsed with an offset.

Example 10. The method of one of examples 7 to 9, where the recess has an aspect ratio between 10:1 and 100:1.

Example 11. The method of one of examples 7 to 10, where the patterned dielectric layer includes a plurality of recesses with a pitch size between 10 nm and 200 nm.

Example 12. The method of one of examples 7 to 11, where the patterned dielectric layer includes a silicon-containing low-k dielectric.

Example 13. The method of one of examples 7 to 12, where the silicon-containing layer covers a top surface of the patterned dielectric layer.

Example 14. A method of processing a substrate that includes: sustaining a first pulsed plasma in a plasma processing chamber by pulsing a source power with a first power pulse train and pulsing a bias power with a second power pulse train that is offset from the first pulse train; exposing the substrate to the first pulsed plasma in the plasma processing chamber to activate a surface of a dielectric layer at a bottom of a recess; sustaining a second plasma including oxygen in the plasma processing chamber; exposing the substrate to the second plasma in the plasma processing chamber to form a bottom passivation layer over the dielectric layer at the bottom of the recess; sustaining a third plasma including fluorine in the plasma processing chamber; and exposing the substrate to the third plasma in the plasma processing chamber to laterally etch the dielectric layer at sidewalls of the recess, where the bottom passivation layer covering the dielectric layer at the bottom of the recess.

Example 15. The method of example 14, further including, prior to the exposing to the third plasma, repeating the steps of exposing to the first pulsed plasma and the exposing to the second plasma.

Example 16. The method of one of examples 14 or 15, where the first pulsed plasma and the second plasma are inductively coupled plasma (ICP).

Example 17. The method of one of examples 14 to 16, where the first power pulse train has a duty cycle between 40% and 60%, and where the second power pulse train has a duty cycle between 40% and 60%.

Example 18. The method of one of examples 14 to 17, where the first power pulse train has a frequency between 50 Hz and 500 Hz.

Example 19. The method of one of examples 14 to 18, where the exposure to the first pulsed plasma is performed for between 10 sec and 60 sec, and where the exposure to the second plasma is performed for between 10 sec and 60 sec.

Example 20. The method of one of examples 14 to 19, where the dielectric layer includes a silicon-containing low-k dielectric, where the first pulsed plasma is generated from a gas including $SiCl_4$, and where the bottom passivation layer includes silicon oxide.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:

forming a bottom passivation layer comprising an oxide over a first portion of a dielectric layer at a bottom of a recess of the substrate, the recess having sidewalls comprising a second portion of the dielectric layer; and performing a lateral etch to etch the second portion of the dielectric layer, the bottom passivation layer covering the first portion of the dielectric layer during the lateral etch, and wherein the forming of the bottom passivation layer comprises exposing the substrate to a first plasma comprising a halogen, and exposing the substrate to a second plasma comprising oxygen to form the bottom passivation layer.

2. The method of claim 1, further comprising repeating the forming of the bottom passivation layer and the lateral etch.

3. The method of claim 1, wherein the forming of the bottom passivation layer further comprises repeating the steps of exposing to the first plasma and exposing to the second plasma to further grow the bottom passivation layer.

4. The method of claim 1, wherein the bottom passivation layer comprises silicon oxide and the dielectric layer comprises a silicon-containing low-k dielectric.

5. The method of claim 1, wherein the first plasma is generated from a gas comprising $SiCl_4$.

6. The method of claim 1, wherein exposing the substrate to the first plasma halogenates a surface of the dielectric layer at the bottom of the recess, and wherein the bottom passivation layer comprises silicon oxide.

7. A method of processing a substrate, the method comprising:

forming a silicon oxide-containing layer over a patterned dielectric layer of the substrate, the patterned dielectric layer comprising a recess having a bottom surface and sidewalls, the silicon oxide-containing layer being thicker over the bottom surface than over the sidewalls, the forming comprising a cyclic plasma process, each cycle of the cyclic plasma process comprising exposing the substrate to a first pulsed plasma, the first pulsed plasma being generated from a gas comprising $SiCl_4$ and sustained by pulsing a source power and a bias power, and exposing the substrate to a second plasma comprising oxygen to form the silicon oxide-containing layer.

8. The method of claim 7, further comprising:

laterally etching the silicon-containing layer and the patterned dielectric layer by exposing the substrate to a third plasma; and stopping the laterally etching before the bottom surface is exposed.

9. The method of claim 7, wherein the source power and the bias power are pulsed with an offset.

10. The method of claim 7, wherein the recess has an aspect ratio between 10:1 and 100:1.

11. The method of claim 7, wherein the patterned dielectric layer comprises a plurality of recesses with a pitch size between 10 nm and 200 nm.

12. The method of claim 7, wherein the patterned dielectric layer comprises a silicon-containing low-k dielectric.

13. The method of claim 7, wherein the silicon-containing layer covers a top surface of the patterned dielectric layer.

14. A method of processing a substrate, the method comprising:

sustaining a first pulsed plasma in a plasma processing chamber by pulsing a source power with a first power pulse train and pulsing a bias power with a second power pulse train that is offset from the first power pulse train;

exposing the substrate to the first pulsed plasma in the plasma processing chamber to activate a surface of a dielectric layer at a bottom of a recess;

sustaining a second plasma comprising oxygen in the plasma processing chamber;

exposing the substrate to the second plasma in the plasma processing chamber to form a bottom passivation layer over the dielectric layer at the bottom of the recess;

sustaining a third plasma comprising fluorine in the plasma processing chamber; and exposing the substrate to the third plasma in the plasma processing chamber to laterally etch the dielectric layer at sidewalls of the recess, wherein the bottom passivation layer covering the dielectric layer at the bottom of the recess.

15. The method of claim 14, further comprising, prior to the exposing to the third plasma, repeating the steps of exposing to the first pulsed plasma and the exposing to the second plasma.

16. The method of claim 14, wherein the first pulsed plasma and the second plasma are inductively coupled plasma (ICP).

17. The method of claim 14, wherein the first power pulse train has a duty cycle between 40% and 60%, and wherein the second power pulse train has a duty cycle between 40% and 60%.

18. The method of claim 14, wherein the first power pulse train has a frequency between 50 Hz and 500 Hz.

19. The method of claim 14, wherein the exposure to the first pulsed plasma is performed for between 10 sec and 60 sec, and wherein the exposure to the second plasma is performed for between 10 sec and 60 sec.

20. The method of claim 14, wherein the dielectric layer comprises a silicon-containing low-k dielectric, wherein the first pulsed plasma is generated from a gas comprising $SiCl_4$, and wherein the bottom passivation layer comprises silicon oxide.

* * * * *